United States Patent [19]
Yamashita et al.

[11] Patent Number: 4,894,206

[45] Date of Patent: Jan. 16, 1990

[54] CRYSTAL PULLING APPARATUS

[75] Inventors: Youji Yamashita, Yokohama; Masakatu Kojima, Yokosuka; Yoshiaki Matsushita, Kawasaki; Masanobu Ogino, Yokosuka, all of Japan

[73] Assignee: Kabushiki Kaisha Toshiba, Kawasaki, Japan

[21] Appl. No.: 91,947

[22] Filed: Sep. 1, 1987

[30] Foreign Application Priority Data

Sep. 22, 1986 [JP] Japan ................... 61-221896

[51] Int. Cl.[4] ........................... C30B 15/30
[52] U.S. Cl. ..................... 422/249; 156/607; 156/617.1; 156/619.1; 156/DIG. 83; 156/618.1
[58] Field of Search ............... 422/249; 156/617 SP, 156/618, 607, DIG. 83

[56] References Cited

U.S. PATENT DOCUMENTS

| 2,686,212 | 8/1954 | Horn et al. | 422/249 |
| 2,892,739 | 6/1959 | Rusler | 422/249 |
| 2,944,875 | 7/1960 | Leverton | 422/249 |
| 3,002,824 | 10/1961 | Francois | 422/249 |
| 3,033,660 | 5/1962 | Okkerse | 156/617 SP |
| 3,078,151 | 2/1963 | Kappelmayer | 422/249 |
| 3,194,691 | 7/1965 | Dikhoff | 156/617 SP |
| 3,241,925 | 3/1966 | VanCakenberghe et al. | 156/617.1 |
| 4,246,064 | 1/1981 | Dewees et al. | 156/617.1 |
| 4,352,784 | 10/1982 | Lin | 422/249 |
| 4,609,425 | 9/1986 | Mateika et al. | 422/249 |

FOREIGN PATENT DOCUMENTS

| 0170856 | 2/1986 | European Pat. Off. | 422/249 |
| 2152801 | 5/1972 | Fed. Rep. of Germany | 156/617.1 |
| 59-8695 | 1/1984 | Japan | 422/249 |
| 60-33294 | 2/1985 | Japan | 422/249 |
| 754767 | 8/1956 | United Kingdom | 156/617.1 |
| 2180469 | 4/1987 | United Kingdom | 422/249 |

OTHER PUBLICATIONS

Goorissen, "Segregation and Distribution of Impurities in the Preparation of Germanium and Silicon", Philips Technical Review, vol. 21, no. 7, pp. 185-220, Jun. 7, 1960.
Brice, Crystal Growth Processes, Blackie & Sons, Glasgow and London, 1956, pp. 114 to 119, and 148-149.
Matare, "General Considerations Concerning the Double-Crucible Method to Grow Uniformly Doped Germanium Crystals of High Perfection", Solid-State Electronics, vol. 6, pp. 163-167, 1963.
Japanese Patent Disclosure (Kokai) No. 60-18634 Suzuki, May, 11, 1985.
Leverton, "Floating Crucible Technique for Growing Uniformly Doped Crystals", Journal of Applied Physics, vol. 29, no. 8, pp. 1241-1244, Aug. 1958.

Primary Examiner—John Doll
Assistant Examiner—Robert M. Kunemund
Attorney, Agent, or Firm—Finnegan, Henderson, Farabow, Garrett & Dunner

[57] ABSTRACT

The present invention discloses a crystal pulling apparatus having a double-crucible structure, wherein an inner crucible is located in an outer crucible. An end of a pipe-like passage is located in a through hole formed in a side wall of an inner crucible located in an outer crucible, and a melt is supplied from the outer crucible to the inner crucible through the pipe-like passage, during crystal pulling. During melting or neckdown, prior to crystal pulling, diffusion of an impurity between the melts in the outer crucible and the inner crucible, and exchange of the melts between the outer crucible and the inner crucible are prevented by the pipe-like passage.

22 Claims, 7 Drawing Sheets

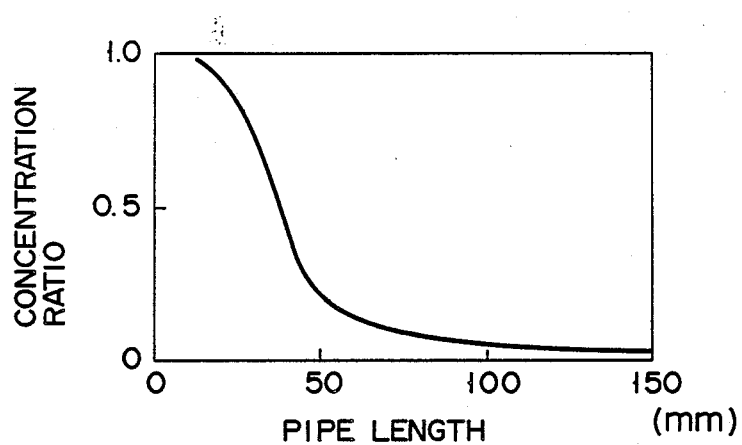
F I G. 3
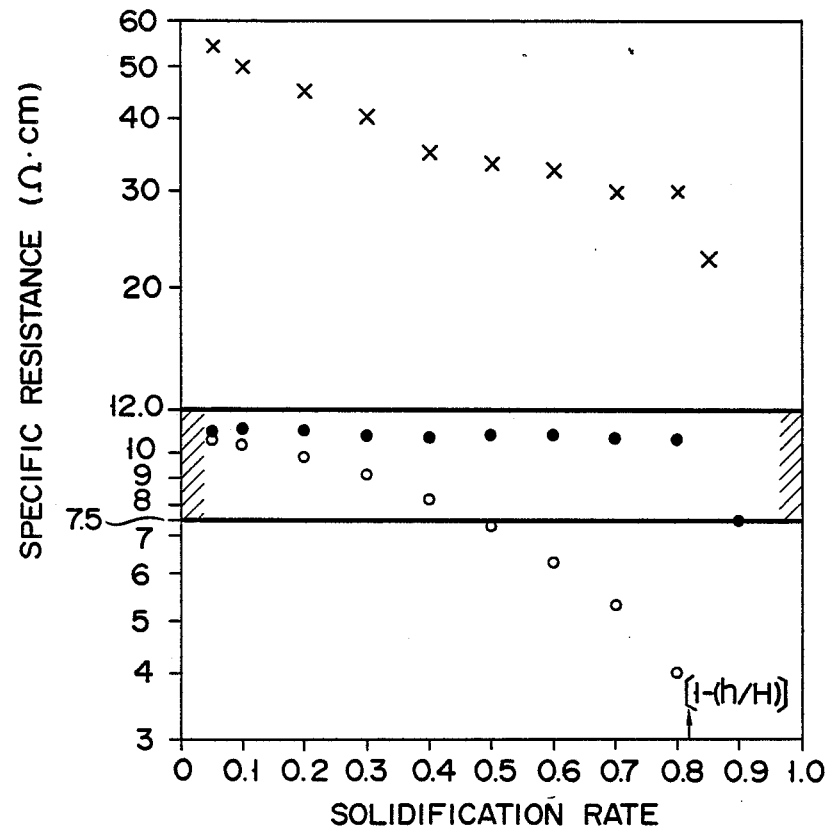
F I G. 4

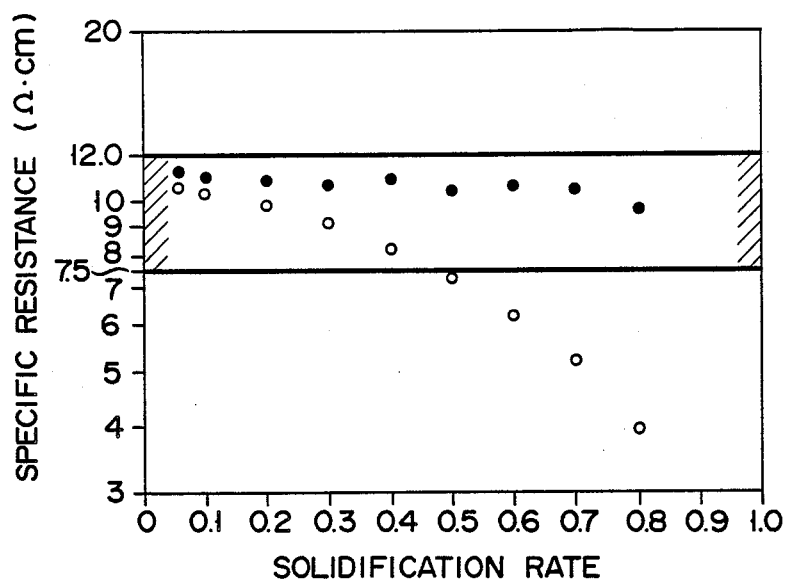
F I G. 8
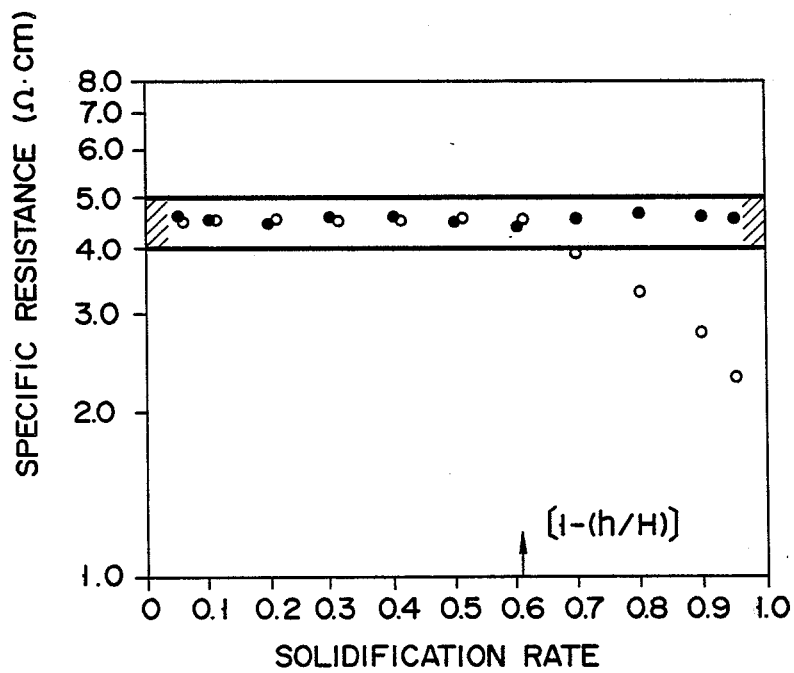
F I G. 9

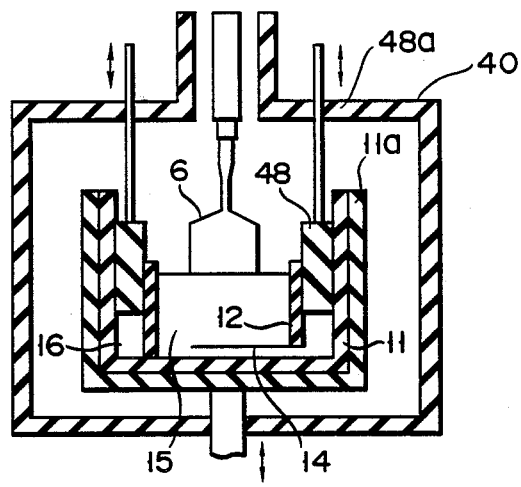
F I G. 10
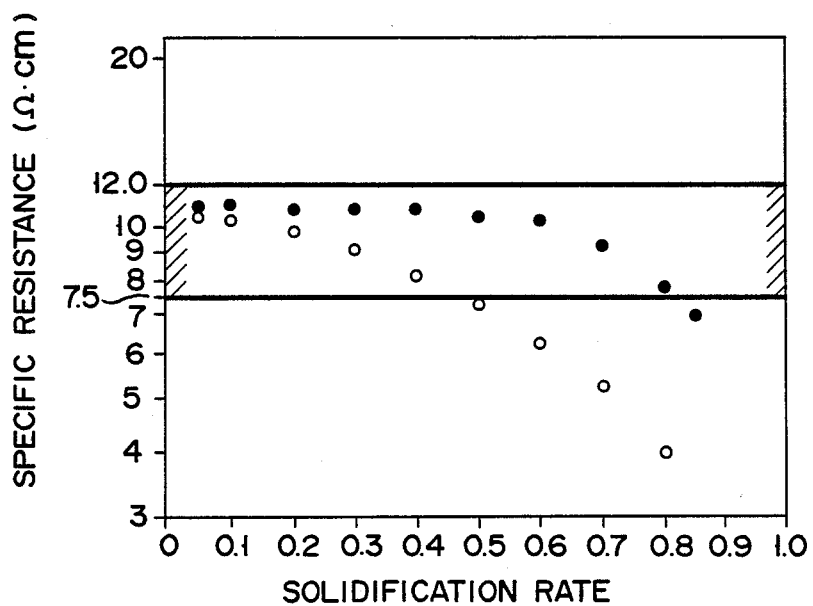
F I G. 11

CRYSTAL PULLING APPARATUS

BACKGROUND OF THE INVENTION

The present invention relates to a crystal pulling apparatus for growing a rod-like semiconductor single crystal and pulling it from a crucible containing a melt.

When a semiconductor single crystal is grown from a melt in a single crucible, by means of the conventional Czochralski technique (to be referred to as the CZ technique hereinafter), impurity concentration distribution C in the longitudinal direction of the grown single crystal is represented by the following equation, as is well known:

$$C = kC_0(1-G)^{k-1}$$

where k is the segregation coefficient, $C_0$ is the initial impurity concentration of the melt, and G is the solidification rate.

Therefore, the impurity concentration distribution in the longitudinal direction of the grown single crystal varies considerably, especially when segregation coefficient k is small, thereby significantly decreasing the formation yield of the single crystal having an impurity concentration within a predetermined range.

Conventionally, a pulling technique known as a double-crucible technique has been proposed, with the aim of solving the above problem and applied to single crystal growth of germanium or silicon. In this technique, two crucibles, i.e., an outer crucible and an inner crucible which communicates with the outer crucible, are used, and a melt surface in the inner crucible is maintained constant.

This conventional double-crucible technique for maintaining the melt surface constant is described in the Journal of Applied Physics Vol. No. 8, Aug. '58 "Floating Crucible Technique for Growing Uniformly Doped Crystals", W. F. Leverton, Author. In this technique, an inner crucible having a through hole at its bottom is placed in an outer crucible separated therefrom with a gap between it and the outer crucible. Therefore, constant the buoyancy and gravity of the inner crucible are balanced, and the surface of the melt in the inner crucible is maintained.

In addition, according to a technique described in Japanese Patent Publication No. 60-18634, an inner crucible is placed in an outer crucible and is moved downward therein by an inner crucible fixing support rod, or else the inner crucible is fixed at a constant position and the outer crucible is moved upward during a crystal pulling process. Thus, the height of the melt surface in the inner crucible is maintained constant during the crystal pulling process, while the melt in the outer crucible is supplied via a through hole in the bottom of the inner crucible, whereby a single crystal rod is pulled up from the inner crucible.

The above conventional double-crucible technique for maintaining the melt surface in the inner crucible at a constant level has the following advantage:

Assume that the impurity concentration of the melt in the outer crucible is $C_0$, and that of the melt in the inner crucible is $C_0/k$ (k is the segregation coefficient of the impurity).

The impurity concentration in a grown pulled single crystal becomes $C_0$, and a melt, the amount and impurity concentration of which are equal to those of a melt portion used for crystal growth, is supplied continuously from the outer crucible to the inner crucible via the through hole. As a result, the impurity concentration of the melt in the inner crucible is maintained at constant value $C_0/k$. Therefore, the impurity concentration of the pulled single crystal is also maintained at constant value $C_0$.

However, the conventional double-crucible technique for maintaining the level of the melt surface in the inner crucible does have the following drawbacks:

(1) When the diameter of the through hole in the bottom of the inner crucible is too large, the melt is exchanged between the outer and inner crucibles by means of convection, a vortex, and the like. As a result, the predetermined differing impurity concentrations in the inner and outer crucibles become undesirably averaged.

(2) Even when the diameter of the through hole is so small as to prevent exchange of the respective melts, impurity diffusion occurs via the through hole if the time required for melting a raw material, consisting of a group of polycrystals for forming a single crystal, is long, or if the time required for neckdown, for obtaining a smaller crystal diameter and increasing the crystal growth speed to remove dislocations, is long. As a result, it is difficult to maintain the impurity concentrations of the respective melts in the inner and outer crucibles at their predetermined constant values.

(3) After solidification of the melt progresses, and the bottom of the inner crucible comes into contact with that of the outer crucible, on account of a decrease in the amount of melt in the outer crucible, the impurity concentration in the pulled single crystal varies along with the solidification rate. In other words, a single crystal with a constant impurity concentration can be obtained only when solidification rate G falls within a range represented as follows:

$$0 \leq G \leq 1 - (h/H)$$

where H is the liquid surface height of the melt in the outer crucible when pulling is started, and h is the liquid surface height of the melt in the inner crucible which should be maintained at a constant value.

SUMMARY OF THE INVENTION

It is therefore an object of the present invention to provide a crystal manufacturing apparatus which can manufacture a pulled single crystal having an impurity concentration which is constant in its longitudinal direction.

The present invention comprises an outer crucible and an inner crucible each containing a melt, and a melt supply passage which is provided in a through hole which extends through a wall portion of the inner crucible, so as to supply the melt from the outer to inner crucible during the single crystal growth process.

BRIEF DESCRIPTION OF THE DRAWINGS

FIG. 3 is a graph showing the relationship between the length of a melt supply passage and the ratio of a melt phosphorus concentration in an outer crucible/a melt phosphorus concentration in an inner crucible;

FIG. 4 is a graph showing the relationship between the solidification rate and the specific resistance respectively of a single crystal produced by the apparatus according to the embodiment shown in FIGS. 1 and 2, and of a single crystal formed by the conventional CZ technique and double-crucible technique;

FIGS. 5A and 5B are sectional views of modifications of the crystal pulling apparatus of FIG. 1, in which FIG. 5A shows the state of the apparatus during neckdown or the initial stage of crown, and FIG. 5B shows the state of the apparatus during pulling after the initial stage of crown, respectively during the single crystal formation process;

FIG. 8 is a graph showing the relationship between the solidification rate and the specific resistance respectively of a single crystal formed by the apparatus of the embodiment shown in FIGS. 6 and 7, and of a single crystal formed by use of the CZ technique;

FIG. 9 is a graph showing the relationship between the solidification rate and the specific resistance of a single crystal formed by the apparatus of the embodiment shown in FIGS. 6 and 7, and that formed by the conventional double-crucible technique;

FIG. 10 is a sectional view of yet another embodiment of the present invention;

FIG. 11 is a graph showing the relationship between the solidification rate and the specific resistance of a single crystal formed by the apparatus of the embodiment shown in FIG. 10, and that formed by the conventional CZ technique; and FIGS. 12A to 12C are sectional views showing modifications of the embodiment of the present invention shown in FIG. 10, in which:

FIG. 12A is a sectional view of a modification in which the bottom of the inner crucible is made higher than that of the outer crucible, thereby increasing the volume of an outer chamber;

FIG. 12B is a sectional view of another modification, in which the outer and inner crucibles are fused integrally; and FIG. 12C is a sectional view of still another embodiment, in which a hollow pipe-like passage is formed in the bottom of the outer crucible of the embodiment shown in FIG. 10.

DETAILED DESCRIPTION OF THE PREFERRED EMBODIMENTS

The embodiments of the present invention will now be described below, with reference to the accompanying drawings.

Figure 1:
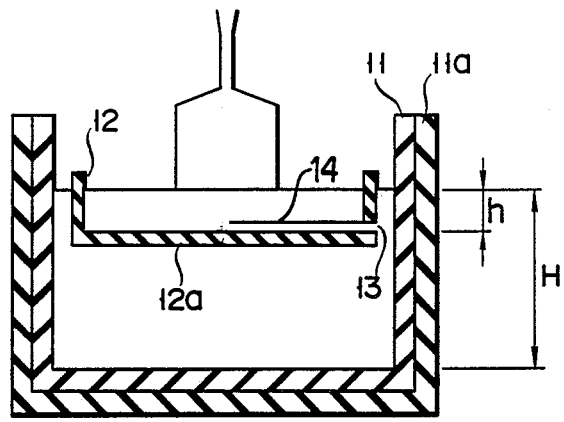
FIG. 1 is a sectional view of an embodiment of a crystal pulling apparatus according to the present invention.

In FIG. 1, outer crucible 11 made of quartz is located inside graphite crucible 11a such that it is in tight contact therewith. Accordingly, the structural strength of outer crucible 11 is reinforced by being in tight contact with graphite crucible 11a. Note that graphite crucible 11a is fixed to a crucible shaft (not shown) which is capable of vertical movement and rotation.

Inner crucible 12 is located inside outer crucible 11, and has through hole 13 which extends through a lower side wall portion, and pipe-like passage 14, serves as a means for supplying melt from outer crucible 11 to inner crucible 12.

Passage 14 is formed of quartz and is fused to the inner side wall surface of inner crucible 12; alternatively, it may be fused to the outer side wall surface thereof.

In addition, hole 13 may be formed in bottom surface 12a of inner crucible 12. In this case, passage 14 may be fused to the outer or inner surface of bottom surface 12a. The diameter of passage 14 is 6 mm, in order that a melt can be supplied in a smooth fashion, and the length thereof is 150 mm, so as to prevent impurity diffusion between outer and inner crucibles 11 and 12 from occurring.

Furthermore, although not shown, inner crucible 12 is externally supported by a support mechanism having a vertical movement function, the liquid surface height (h) of the melt in inner crucible 12 being maintained constant by means of the vertical movement of this support mechanism and outer crucible 11. Note that the support mechanism for inner crucible 12 has a vertical movement function and it may have a rotation function.

Figure 2:
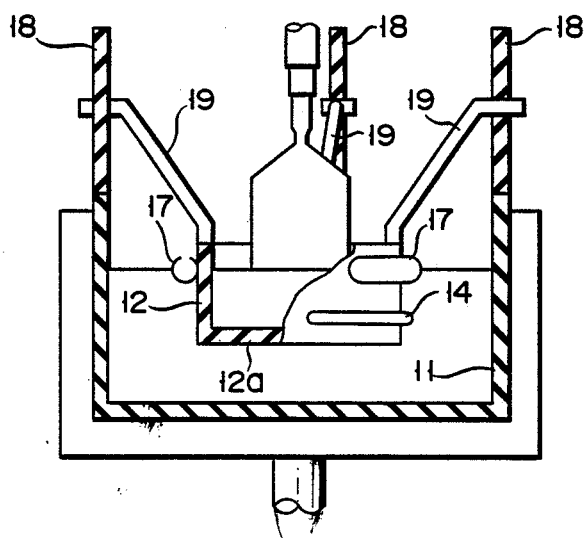
FIG. 2 is a sectional view showing in detail a means for maintaining the melt surface in the inner crucible, shown in FIG. 1, at a constant level.

FIG. 2 is a sectional view showing an embodiment in which the support mechanism, for maintaining the liquid surface of the melt in inner crucible 12, shown in FIG. 1, at a constant level, is improved. In FIG. 2, buoyancy means 17 is located on the outer wall surface of inner crucible 12. Buoyancy means 17 is made of quartz and may be of any shape (such as a tubular or spherical shape), as long as it is buoyant.

Buoyancy means 17 provides a constant level of buoyancy to inner crucible 12, so that the depth of the melt in inner crucible 12 is maintained constant, regardless of variations pulling speed during the formation of a single crystal.

Three quartz sliding rods 18 extend from the upper edge of outer crucible 11. Three support arms 19, which are bent outwardly, extend from the upper edge of inner crucible 12 toward outer crucible 11. The distal end of each arm 19 slides along a corresponding one of rods 18, so that inner crucible 12 maintains a predetermined distance with respect to outer crucible 11. A sliding portion of arm 19 and that of the corresponding rod 18 are sufficiently far from the melt surface that their sliding surfaces do not become fused with each other. In addition, a support mechanism of arm 19 and rod 18 is housed in a closed vessel (not shown), so that no heat loss occurs outside the closed vessel. Note that passage 14 is formed in the outer side wall of inner crucible 12.

In addition to being a melt supply means, passage 14 also serves to prevent the introduction of an impurity from a chamber having a higher impurity concentration to that having a lower impurity concentration, even when there is almost no flow of melt between outer and inner crucibles 11 and 12 during, for example, melting of a raw material and the neckdown part of the crystal pulling process. Introduction of the impurity, which occurs when almost no melt flows, is considered to be the diffusion of the impurity. The distance, the impurity has diffused until time T, can be given by a known formula about diffusion:

$$C(x, T) = Cm(0) \cdot e^{-x^2/2DT}$$

is $\sqrt{2DT}$ (where D is a diffusion coefficient of an impurity in a melt). For example, when time T is 5 hours (the time interval from melting until the end of neckdown is, at most, 5 hours) and phosphorus of $D = 5 \times 10^{-4}$ cm²/sec is used as an impurity, propagation distance $\sqrt{2DT}$ is 42 mm. Therefore, if the length of passage 14 is 42 mm or greater, the propagation of an impurity between the inner and outer chambers can be prevented. In addition, if the length of passage 14 is 42 mm or greater, virtually no exchange of melt (caused by convection, a vortex, and the like) occurs between the inner and outer crucibles.

FIG. 3 is a graph showing the relationship between the length of passage 14 and the phosphorus concentration in the melt in outer crucible 11/the phosphorus concentration in the melt in inner crucible 12, when 3 hours have passed after the melt in inner crucible 12 was doped with phosphorus and then left to stand. Note that the diameter of outer crucible 11 is 8 inches, and silicon is charged with 3 kg of silicon, the diameter of inner crucible 12 is 5 inches and the liquid surface height of the melt in inner crucible 12 is 20 mm, the inner diameter of passage 14 is 6 mm, and the temperature of the melt is 1,480° C. As is apparent from FIG. 3, an impurity in the melt in the inner chamber diffuses therefrom to the outer chamber when the length of passage 14 is 10 mm, an impurity diffusion restricting effect can be obtained when it is about 30 mm, and an almost complete impurity diffusion restricting effect can be obtained when it is about 100 mm.

FIG. 4 is graph showing the relationship between the solidification rate and the specific resistance distribution of single crystals respectively formed by the conventional double-crucible and CZ techniques, when a 3-inch-diameter single crystal is grown by doping phosphorus under the conditions where the silicon charge is 10 kg, the specific resistance ranges from 7.5 to 12.0 $\Omega \cdot cm$, and the target value of resistance at the head of the pulled single crystal is 11.5 $\Omega \cdot cm$.

In FIG. 4, solid dots indicate the specific resistance distribution of the single crystal formed by the embodiment shown in FIGS. 1 and 2; hollow dots, the specific resistance distribution (theoretical value) of a single crystal formed by the CZ technique; and crosses, the specific resistance distribution of a single crystal formed by the double-crucible technique.

As is apparent from FIG. 4, when a pipe-like passage as a melt supply means is not employed for the double-crucible technique, the specific resistance of a single crystal, formed at an initial stage of crystal pulling, is high. In addition, the outflow of the melt or diffusion of an impurity takes place from the inner to outer crucible during melting and neckdown, prior to the forming of a crown.

Since the embodiment of the present invention has a pipe-like passage serving as a melt supply means, exchange of the melt or diffusion of the impurity between the inner and outer crucibles can be prevented, as is apparent from the specific resistance of the single crystal.

Furthermore, when the CZ technique is used, the yield of a single crystal, in terms of a specific resistance, is less than 50%. However, the yield rises to 80% in the embodiment of the present invention.

Figure 5A:
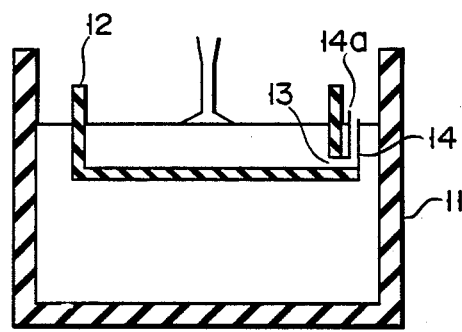
Figure 5B:
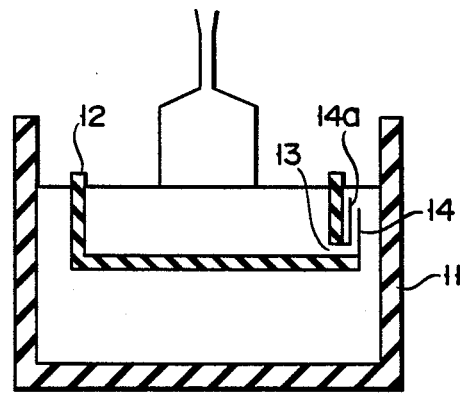

FIGS. 5A and 5B show a modification of the embodiment shown in FIG. 1, in which passage 14 extends from hole 13 of inner crucible 12 toward the liquid surface of the melt in outer crucible 11, and melt supply distal end port 14a projects from the melt surface during neckdown or the initial stage of crown. Note that the passage 14 is as long as the liquid surface of the melt in crucible 12 is high.

After the initial stage of crown, the inner crucible is pushed down until the liquid surface of the melt be above port 14a of passage 14. Then, as is shown in FIG. 5B, the melt is supplied via port 14 from outer crucible 11 into inner crucible 12.

According to the modification shown in FIGS. 5A and 5B, exchange of the melt and diffusion of the impurity between the outer and inner crucibles can be completely prevented during neckdown or crown. In addition, since the melt supply distal end port of the pipe-like passage is located near the liquid surface of the melt in the outer crucible, the melt with a lower oxygen concentration is supplied to the inner crucible after oxygen separated from the quartz crucible volatilizes from the liquid surface of the melt in the outer crucible. Therefore, an increase in the concentration of oxygen in the grown single crystal, caused by the quartz crucible, can be prevented from occurring. Note that the concentration of oxygen in the single crystal is 1.0 to $1.3 \times 10^{18}$ atoms/cc in this modification, while in the embodiment shown in FIG. 1, it is 1.4 to $1.7 \times 10^{18}$ atoms/cc.

Figure 6:
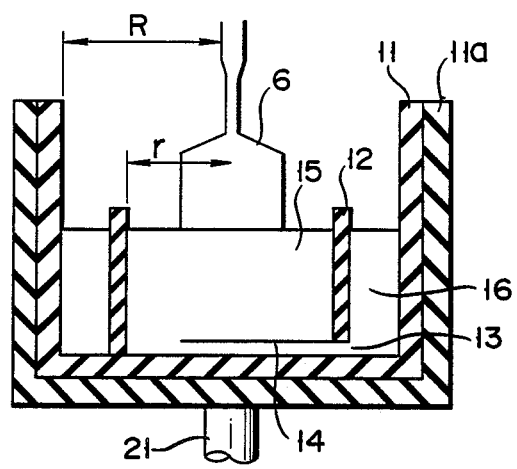
FIG. 6 is a sectional view of another embodiment of the present invention.

Another embodiment of the present invention will now be described, with reference to FIGS. 6 to 9. For the sake of illustrative simplicity, the vessel for containing a hot zone, the heat insulating cylinder, the heater, and the like are omitted from the drawings. In FIG. 6, graphite crucible 11a is fixed on crucible shaft 21, which is capable of vertical movement and rotation, and hollow cylindrical outer crucible 11 which has a bottom made of quartz is fitted in graphite crucible 11a. Outer crucible 11 is held and reinforced by graphite crucible 11a. Cylindrical inner crucible 12 made of quartz is located inside outer crucible 11, and has through hole 13 and pipe-like quartz passage 14 as a melt supply means communicating with hole 13. The lower end portion of inner crucible 12 is fused to the inner bottom surface of outer crucible 11. Therefore, the interior of cylindrical inner crucible 12 forms inner chamber 15 for containing a doped melt, and inner and outer crucibles 12 and 11 form outer chamber 16 for containing an undoped melt.

Passage 14 has an inner diameter of 6 mm, and is relatively thick, so that the melt can be supplied smoothly from outer chamber 16 into inner chamber 15. Further, passage 14 has a length of 150 mm, and is long, so that impurity diffusion can hardly occur.

Passage 14 is transversely wound around and fused on the outer surface of inner crucible 12; alternatively, it may be fused on, for example, the inner side surface of inner crucible 12 or the bottom surface of outer crucible 11, as long as exchange of the melt and impurity diffusion between inner and outer crucibles 12 and 11 can be prevented.

In the embodiment shown in FIG. 6, the outer and inner crucibles are formed integrally. In addition, when the outer and inner crucibles are coaxially arranged, and assuming that the radius of the outer crucible is R, the radius of the inner crucible is r, and the segregation coefficient of an impurity is k, the following relationship is satisfied at the liquid surface height of the melt to be pulled:

$$r = \sqrt{k} R$$

When the melt in tee outer chamber is undoped and the melt in the inner chamber is doped with impurity concentration ($C_i$), a single crystal with impurity concentration ($kC_i$) is pulled from the inner chamber while the undoped melt is supplied from the outer to inner chamber.

In this case, when the height of the melt surface in the inner chamber is decreased by microamount $\Delta H$ as the single crystal is pulled, a total impurity amount taken into the single crystal is as follows:

$$\pi R^2 \Delta H \times k C_i$$

In addition, an impurity amount originally present in the melt in the inner chamber having a height of $\Delta H$ is represented by $$\pi r^2 \Delta H \times C_i$$
$$= \pi r^2 \Delta H \times (R^2/R^2) C_i \quad \text{(because } r = \sqrt{kR}\text{)}$$
$$= \pi R^2 \Delta H \times k C_i$$

and thereby corresponds to the total impurity amount taken into the single crystal.

That is, the impurity present in the melt in the inner chamber having the height of $\Delta H$ is completely taken into a grown crystal. Therefore, the impurity concentration in the melt in the inner chamber is always maintained at constant value $C_i$, and that in the pulled crystal is always maintained at constant value $kC_i$.

Furthermore, according to this embodiment in which the outer and inner crucibles are integrally formed, the pipe-like passage as a melt supply means can be disposed in the bottom of the outer crucible, so that a crystal having a constant specific resistance in the longitudinal direction of the pulled single crystal can be obtained to the end.

Note that square roots $\sqrt{k}$ of segregation coefficients of phosphorus (P), boron (B), and antimony (Sb) are 0.59, 0.89, and 0.14, respectively. As is apparent from these values, this embodiment is most advantageous and effective for phosphorus.

Figure 7:
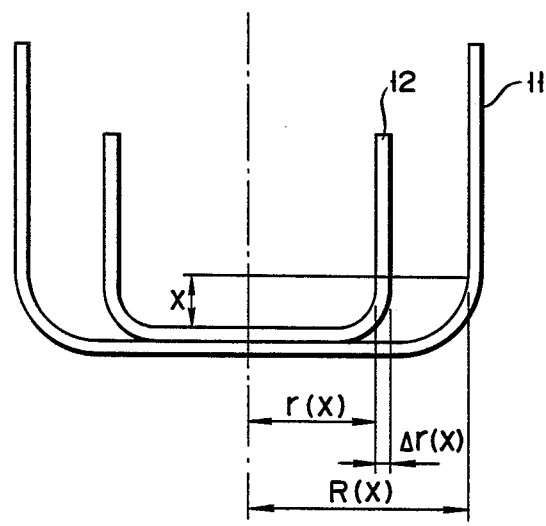
FIG. 7 is a sectional view of a modification of the embodiment shown in FIG. 6.

FIG. 7 shows a modification of the embodiment shown in FIG. 6, in which outer and inner crucibles 11 and 12 are connected with each other at their bottoms.

That is, the crucibles may take any shape as long as the equation $r = \sqrt{kR}$ can be established except for fused portions of the bottoms which are not utilized in pulling.

Note that the above equation is replaced with the following equation when thickness $\Delta r$ of inner crucible 12 is taken into consideration:

$$r^2/[R^2 - (r + \Delta r)^2 + r^2] = k$$

where
R: an inner diameter (radius) of outer crucible 11 at height x of the liquid surface
r: an inner diameter (radius) of inner crucible 12 at height x of the liquid surface
$\Delta r$: a thickness of the wall of inner crucible 12 at height x of the liquid surface Note that when $\Delta r$ of the above equation is neglected, the equation $r = \sqrt{kR}$ is obtained.

When the inner diameter of the inner crucible with respect to the inner diameter of the outer crucible is selected so as to satisfy the above equation $r = \sqrt{kR}$, an impurity concentration taken into single crystal 6 pulled from inner crucible 12 is maintained constant by the effect described above.

In addition, since outer and inner crucibles 11 and 12 are integrally fixed with each other, inner crucible 12 can be rotated in synchronism with rotation of outer crucible 11 during growth of the single crystal. Therefore, similar to the conventional CZ technique, conditions suitable for growing a single crystal, such that a temperature distribution in the radial direction is decreased toward the center in the melt in inner crucible 12, can be obtained. In the conventional double-crucible technique, it is difficult for the inner crucible to have a rotation function.

An impurity concentration in the single crystal grown by the apparatus of the embodiment shown in FIG. 6 will be described below with reference to FIGS. 8 and 9.

Note that conditions of manufacturing samples are such that a silicon charge is 10 kg and phosphorus as an impurity is placed in a small hole open at the distal end of the seed. After melting, i.e., liquid surface heights in the inner and outer chambers are made even and stabilized, the distal end of the seed is dipped into the melt and melted therein, thereby growing a doped silicon single crystal of 3 inch diameter.

FIG. 8 shows a comparison between specific resistance distributions in the single crystal formed by the apparatus of the embodiment shown in FIG. 6 and that formed by the conventional CZ technique. Note that in FIG. 8, said dots indicate the specific resistance distribution (experimental value) in the single crystal formed by the apparatus of the embodiment shown in FIG. 6; and hollow dots, the specific resistance distribution (theoretical value) in the single crystal formed by the CZ technique under the same conditions.

As is apparent from FIG. 8, in the conventional CZ technique, when a solidification rate is increased, the specific resistance is decreased (i.e., impurity concentration is increased) in the longitudinal direction of the pulled single crystal. On the contrary, in the single crystal formed by the embodiment shown in FIG. 6, the specific resistance distribution (i.e., the impurity concentration) is substantially uniform.

Note that it is confirmed that when the pipe-like passage is not used, a large amount of an impurity in the melt in the inner chamber is diffused into the melt in the outer chamber after neckdown and before crown. In addition, when a target value of the specific resistance of the head is set to be 11.5 $\Omega$·cm using a dopant having a specific resistance range of 7.5 to 12.0 $\Omega$·cm as a target value, the yield of the single crystals obtained by the conventional CZ technique is less than 50%. However, the single crystals obtained in the embodiment shown in FIG. 6 are all good products.

FIG. 9 is a graph showing a comparison between the specific resistance distributions of the single crystal formed by the apparatus of the embodiment shown in FIGS. 6 and 7 and the single crystal formed by the conventional double-crucible technique.

In FIG. 9, solid dots indicate the specific resistance distribution of the single crystal formed by the apparatus of the embodiment shown in FIGS. 6 and 7; and hollow dots, the specific resistance distribution (theoretical value) of the single crystal formed by the conventional double-crucible technique. In the conventional double-crucible technique, when a target value of the head is set to be 4.5 $\Omega$·cm using a phosphorus dopant having a specific resistance range of 4 to 5 $\Omega$·cm, the specific resistance falls outside the above range immediately after the solidification rate exceeds $1 - (h/H)$. However, the single crystals formed in this embodiment are all good products.

Finally, still another embodiment of the present invention will be described below. In FIG. 10, the same parts as in FIG. 6 are denoted by the same reference numerals. In FIG. 10, graphite crucible 11a is disposed in closed vessel 40 made of stainless steel, and a double-structure crucible having outer and inner crucibles 11 and 12 in graphite crucible 11a is housed in vessel 40. Outer and inner crucibles 11 and 12 form outer chamber 16, and inner chamber 15 is formed in inner crucible 12. Ring-like quartz ballast pin 48 is disposed in outer chamber 16 to have an interval of 1 to 2 mm therewith to slide on the wall of outer chamber 16. Pin 48 is connected from outside vessel 40 to support rod 48a capable of vertical movement.

An operation of the crystal manufacturing apparatus of the present invention shown in FIG. 10 is as and a 3-inch single crystal rod doped with phosphorus as an impurity is to be grown, and a dopant is placed at the seed distal end in two stages. An amount of the dopant at the lower stage is set such that an impurity concentration of the entire silicon melt becomes $kC_0$. An amount of the dopant at the upper stage is set such that the impurity concentration of the melt in the inner chamber becomes $(1-k)C_0$. When the dopant at the lower stage of the seed is melted, pin 48 is vertically moved to mix the melts in the inner and outer chambers so that the impurity concentrations therein are rendered uniform. Then, the upper stage of the seed is melted into the melt in the inner chamber. As a result, the impurity concentration of the melt in the outer chamber becomes $kC_0$, and that of the melt in the inner chamber including the dopant at the upper and lower stages becomes $C_0$.

Although the melt in the inner chamber decreases during crystal pulling, rod 48a is vertically moved along with an amount of crystal pulling to allow pin 48 to sink in the melt in the outer chamber, thereby supplying the melt in outer chamber 16 into the inner chamber through passage 14. By supplying the melt into inner chamber 15, the liquid surface height of the melt in inner chamber 15 always remains constant. By maintaining the surface of the melt in inner chamber 15 constant, single crystal 6 can be pulled while the impurity concentration of the melt in inner chamber 15 is always maintained at constant value $C_0$, in accordance with the same principles as that of the conventional double-crucible technique.

FIG. 11 is a graph in which the relationship between the solidification rate and the specific resistance of the pulled single crystal formed by the apparatus shown in FIG. 10 is compared to the relationship between the solidification rate and the specific resistance of the single crystal formed by the conventional CZ technique.

As is apparent from FIG. 11, the single crystal formed by the apparatus according to this embodiment has the specific resistance falling within a range of 7.5 to 12.0 Ω·cm until the melt in the outer chamber is completely consumed, and its yield is more than 80%. On the contrary, in the single crystal formed by the conventional CZ technique, the specific resistance is decreased when the solidification rate is increased, and the yield of the single crystal is less than 50%.

According to the embodiment shown in FIG. 10, ratio r/R diameter r of inner crucible 12 to diameter R of outer crucible 11 need not be $\sqrt{k}$ but may be arbitrarily selected. In addition, ratio r/R may be set to be $\sqrt{k}$, and at the same time, only the melt in the inner chamber may be doped with an impurity and the melt in the outer chamber may be undoped.

Figure 12A:
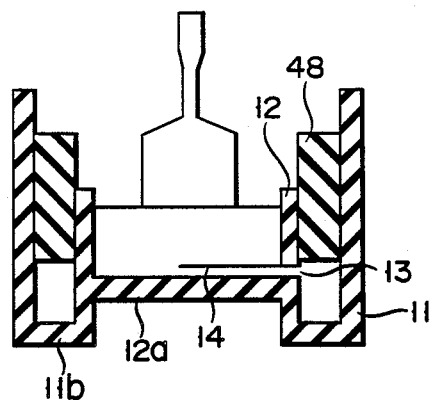
Figure 12B:
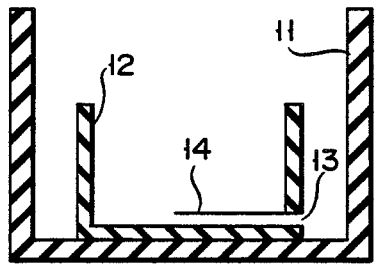
Figure 12C:
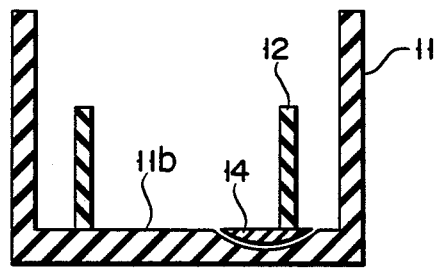

FIG. 12A shows a modification of the embodiment shown in FIG. 10, in which bottom 12a of inner crucible 12 is set higher than bottom 11b of outer crucible 11 so that a volume of the outer chamber is increased. FIG. 12B shows a modification in which outer and inner crucibles 11 and 12 are fused with each other to be integrally constructed, thereby facilitating assembly. FIG. 12C shows a modification in which hollow pipe-like passage 14 is located in bottom 11b of outer crucible 11 in a double-crucible structure obtained by locating inner crucible 12 in outer crucible 11 shown in FIG. 10. Modifications shown in FIGS. 12B and 12C are modifications also of the pulling apparatus shown in FIG. 6.

In addition, it is a matter of course that a plurality of passages 14 may be formed.

According to this embodiment, the melt doped with an impurity may be contained in the outer chamber and the undoped melt may be contained in the inner chamber so that the impurity concentration of the melt in the inner chamber is increased during formation of the single crystal. On the contrary, the undoped melt may be contained in the outer chamber and the melt doped with an impurity may be contained in the inner chamber so that the impurity concentration of the melt in the inner chamber is decreased during formation of the single crystal.

Embodiments of the present invention have been described above. However, these embodiments can be further modified on the basis of the technical principle of the present invention. For example, the materials constituting the crucibles or pipes may be changed, and the shapes of the outer and inner chambers are not limited to those described herein. In addition, the method of fixing the inner crucible to the outer crucible is not limited; for example, the inner crucible need not be fused to the outer crucible, but may instead be fitted therein. Furthermore, a fixing method, a mounting position, a shape, and the number of the pipes are not limited to those described herein.

The present invention can be applied to a crystal growth method which requires doping of an impurity other than silicon and, more particularly, to growth of Group III-V compound crystals such as GaAs and GaP.

What is claimed is:

1. A crystal pulling apparatus comprising:
   an outer crucible for containing an undoped melt;
   an inner crucible, arranged concentrically and integrally with said outer crucible, containing a melt doped with an impurity, and having a diameter $\sqrt{k}$ times that of said outer crucible, when a segregation coefficient of the impurity if k;
   a through hole formed in said inner crucible; and
   melt supply means, one end of which is located in said through hole and an other end of which is located in the melt contained in said outer crucible, for supplying the melt contained in said outer crucible into said inner crucible during crystal pulling, for preventing diffusion of the doping impurity between the melt in said outer crucible and that in said inner crucible, and for preventing exchange of the melt between said outer crucible and said inner crucible before the forming of a crown, said melt supply means being a passage having a length equal to or greater than a diffusion constant $\sqrt{2DT}$, where D is the diffusion coefficient of the doping impurity in the melt and T is the time interval from the dissolving of the doping impurity into the melt until the end of neckdown.

2. An apparatus according to claim 1, wherein said melt supply means comprises a cavity for enabling an outer chamber to communicate with an inner chamber.

3. An apparatus according to claim 1, wherein said melt supply means comprises a hollow pipe-like passage.

4. An apparatus according to claim 1, wherein said outer crucible and said inner crucible are made of quartz.

5. An apparatus according to claim 3, wherein said pipe-like passage prevents diffusion of an impurity between the melts in said outer crucible and said inner crucible, and exchange of the melts between said outer crucible and inner crucible, when crystal pulling is not being performed.

6. A crystal pulling apparatus comprising:
an outer crucible for containing a melt;
an inner crucible, arranged concentrically and integrally with said outer crucible, for containing a melt;
a through hole formed in said inner crucible;
melt supply means, an end of which is located in said through hole and an other end of which is located in the melt contained in said outer crucible, for supplying the melt contained in said outer crucible into said inner crucible, during crystal pulling, for preventing diffusion of the doping impurity between the melt in said outer crucible and that in said inner crucible, and for preventing exchange of the belt between said outer crucible and said inner crucible before the forming of a crown, said melt supply means being a passage having a length equal to or greater than a diffusion constant $\sqrt{2DT}$, wherein D is the diffusion coefficient of the doping impurity in the melt and T is the time interval from the dissolving of the doping impurity into the melt until the end of neckdown; and
a ballast pin for moving vertically in an outer chamber formed by said outer crucible and said inner crucible to maintain a liquid surface of the melt in said inner crucible at a constant level.

7. An apparatus according to claim 6, wherein a bottom of said outer crucible is located at a position lower than that of a bottom of said inner crucible.

8. An apparatus according to claim 6, wherein a bottom of said inner crucible is fused integrally with a bottom of said outer crucible.

9. An apparatus according to claim 6, wherein said melt supply means comprises a cavity, formed in a bottom of said outer crucible, for enabling an inner chamber, formed by said inner crucible, to communicate with said outer chamber.

10. An apparatus according to claim 6, wherein said melt supply means comprises a pipe-like passage.

11. An apparatus according to claim 6, wherein said outer crucible, said inner crucible, and said ballast pin are made of quartz.

12. An apparatus according to claim 10, wherein said pipe-like passage is made of quartz.

13. A crystal pulling apparatus comprising:
an outer crucible for containing a melt;
an inner crucible located in said outer crucible and floating in the melt contained in said outer crucible;
a through hole formed in said inner crucible; and
melt supply means for supplying the melt from said outer crucible into said inner crucible during crystal pulling, one end of said melt supply means being located in said through hole, an other end of said melt supply means projecting above a surface of the melt contained in said outer crucible before the initial stage of crown, and being located below the surface of the melt contained in said outer crucible after the initial stage of crown.

14. An apparatus according to claim 13, wherein buoyancy means and a support mechanism for sliding said inner crucible in the vertical direction are arranged on a side wall of said inner crucible.

15. An apparatus according to claim 14, wherein said buoyancy means comprises a hollow pipe.

16. An apparatus according to claim 14, wherein said buoyancy means comprises a hollow sphere.

17. A crystal pulling apparatus comprising:
an outer crucible for containing a melt;
an inner crucible located in said outer crucible and floating in the melt contained in said outer crucible;
a through hole formed in said inner crucible; and
melt supply means comprising a hollow pipe-like passage which prevents diffusion of a doping impurity between the melt in said outer crucible and that in said inner crucible, and exchange of the melt between said outer crucible and said inner crucible when crystal pulling is not performed, said pipe-like passage having a length equal to or greater than a diffusion distance $\sqrt{2DT}$, where D is the diffusion coefficient of the doping impurity in the melt and T is the time interval from the dissolving of the doping impurity into the melt until the end of neckdown.

18. An apparatus according to claim 14, wherein said outer crucible and said inner crucible are made of quartz.

19. An apparatus according to claim 13, wherein buoyancy means and a support mechanism for vertically sliding said inner crucible are arranged on a side wall of said inner crucible.

20. An apparatus according to claim 19, wherein said buoyancy means comprises a hollow pipe.

21. An apparatus according to claim 19, wherein said buoyancy means comprises a hollow sphere.

22. An apparatus according to claim 13, wherein said outer crucible and said inner crucible are made of quartz.

* * * * *